(12) United States Patent
Dotan

(10) Patent No.: US 6,353,222 B1
(45) Date of Patent: Mar. 5, 2002

(54) DETERMINING DEFECT DEPTH AND CONTOUR INFORMATION IN WAFER STRUCTURES USING MULTIPLE SEM IMAGES

(75) Inventor: Noam Dotan, Givatayim (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/146,364

(22) Filed: Sep. 3, 1998

(51) Int. Cl.⁷ ................................................. H01J 37/00
(52) U.S. Cl. ........................................ 250/310; 250/307
(58) Field of Search ................................ 250/310, 306, 250/307

(56) References Cited

U.S. PATENT DOCUMENTS

| | | | |
|---|---|---|---|
| 3,927,320 A | 12/1975 | Chatfield et al. | 250/307 |
| 4,420,686 A | 12/1983 | Onoguchi et al. | 250/310 |
| 4,894,540 A | 1/1990 | Komatsu | 250/307 |
| 4,941,980 A | 7/1990 | Halavee et al. | 250/310 |
| 4,996,434 A * | 2/1991 | Tanaka | 250/492.3 |
| 5,212,383 A | 5/1993 | Scharf | 250/310 |
| 5,233,191 A * | 8/1993 | Noguchi et al. | 250/306 |
| 5,329,125 A | 7/1994 | Feuerbaum | 250/442.1 |
| 5,466,940 A | 11/1995 | Litman et al. | 250/397 |
| 5,594,245 A | 1/1997 | Todokoro et al. | 250/310 |
| 5,659,172 A | 8/1997 | Wagner et al. | 250/307 |
| 5,699,447 A | 12/1997 | Alumot et al. | 342/145 |

OTHER PUBLICATIONS

M.R. Lee, "From atomic–scale defects to global environmental change; applications of SEM and TEM to mineral weathering," Microscopy and Analysis, Nov. 1997, pp. 19–21.

* cited by examiner

*Primary Examiner*—Kiet T. Nguyen
(74) *Attorney, Agent, or Firm*—Sughrue Mion Zinn MacPeak & Seas PLLC

(57) ABSTRACT

A SEM review station provides a plurality of images of a defect area of a wafer structure, particularly a semiconductor integrated circuit, during manufacture. Inspection of the multiple images provides a depth determination and/or contour information. Knowing the depth of a defect is useful for determining a corresponding manufacturing step and chamber in which a defect was introduced. One SEM review station provides a stereoscopic SEM image signal by combining signals from two images taken from different perspectives, and determines the depth of a defect. Another SEM review station provides contour information through three images taken with varying directions of electron detection so is that shading differences can be used to characterize the defect as flat, as a protrusion, or as a recess.

5 Claims, 11 Drawing Sheets

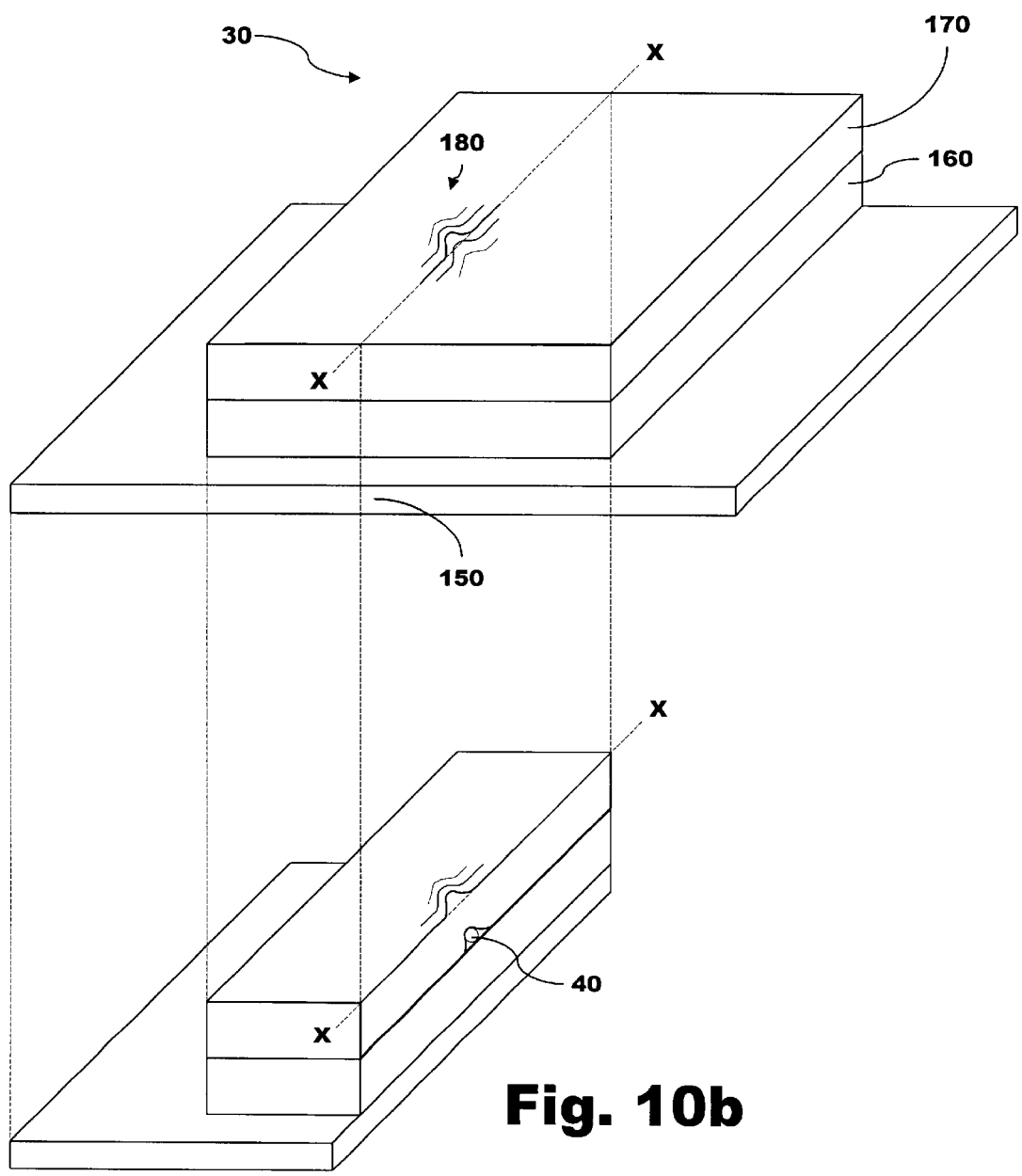

DETERMINING DEFECT DEPTH AND CONTOUR INFORMATION IN WAFER STRUCTURES USING MULTIPLE SEM IMAGES

BACKGROUND OF THE INVENTION

1. Field of the Invention

The present invention relates to using scanning electron microscopy (SEM) to study defects in wafer structures. Wafer structures are articles having a plurality of very thin layers on a wafer. An example of a wafer structure is an integrated circuit fabricated on a semiconductor wafer.

More particularly, this invention relates to a method of obtaining defect depth information which can be used to help determine the layer of a wafer structure in which a defect is located. In other words, the invention ultimately involves classifying and determining the depth of a defect. Defect depth information may include contour height information.

The invention is advantageous in that, by determining the depth of a defect, a corresponding processing step may be identified for further scrutiny.

2. Background

Until the present invention, the study of defects in wafer structures has focused on determining whether the particular wafer structure is faulty and, if so, whether the wafer structure should be discarded or kept. This conventional approach will now briefly be described.

Many steps are typically required in producing a wafer structure. The sizes involved are very small, however, and it is not unusual for a defect to occur. An example of such a defect, which will be mentioned many times in this discussion, is the accidental introduction of an undesired particle. Many other defects are possible, as is well known to those acquainted with this field, and the invention is to be understood to relate to all detectable defects. For the sake of focusing attention on the invention, however, the particle defect will provide an easily-understandable example of a defect. A particle is an example of a protrusion defect. Protrusion defects "stick up" from the surface. Another kind of defect is a recess defect, like a pit or a scratch. Recess defects recede into the surface.

It will be appreciated that a protrusion defect may include a particle or other unwanted structure on top of a surface, or a bump that is a manifestation of a particle/unwanted structure below a surface. Since the production of wafer structures involves many layers, it may be more common for a protrusion defect to be manifested as a bump which reflects a sub-surface particle, instead of as a particle itself on top of a surface.

Because defects occur, inspections are necessary. Inspecting only the finished product is economically impractical, for several reasons. One reason is that a defect that occurs early in the manufacturing process might be obscured by the layers deposited in subsequent steps. Another reason is that, if a defect in a wafer structure can be detected earlier, then the further devotion of time and resources to that particular wafer structure can be avoided.

Although the inspection of only the finished wafer structure is economically impractical, so too is the inspection of the wafer structure after each manufacturing or process step. The production of wafer structures typically involves hundreds of steps, and inspecting after each step would unacceptably slow production. Furthermore, each inspection adds to the cost of the final wafer structure, and an inspection after each step would make the end product prohibitively expensive.

In view of the foregoing, inspections are normally performed after only critical steps. Every different wafer structure product will necessarily have somewhat different critical steps, and persons versed in the production of wafer structures already understand how to select which steps are critical and which are not, and how to balance such a selection against the economic considerations. Practical considerations also take a role in determining when inspections are to be performed. For example, where automated robotic processing is involved, it may be the case that several steps are performed automatically and that access to the wafer structure is not possible until a final step. Thus, a critical step in such a system might be the final step in a series of automatically performed steps.

After each critical step in the manufacturing process, the wafer structure is inspected. In particular, the wafer structure may be placed in an inspection station for initial defect detection.

One example of an inspection station is an optical inspection station, such as that described in U.S. Pat. No. 5,699,447 to Alumot et al., hereby incorporated by reference. This inspection station for initial defect detection may be referred to as a first optical review station, or as a first optical inspection station.

The first optical inspection station performs a die to die or a cell to cell inspection and flags x,y coordinates for cells or dies differing from the others. Although no two dies/cells will be perfectly identical, an optical inspection station such as that described above has a threshold. Where the differences exceed the threshold, the die/cell is flagged. The comparison is statistical in nature, and lends itself to computer processing.

The optical inspection station provides a notification of the flagged locations that contain differences that are supposed by the optical inspection station to be defects (i.e., the differences that exceed the threshold). This notification typically takes the form of a defects map.

A defects map provides, for each supposed defect in the wafer structure, the location of the supposed defect. To be more precise, the defects map treats the wafer structure as a plane and provides planar coordinate information (i.e., x and y coordinates) so that the supposed defects can be located for further inspection. The inspection equipment of the optical inspection station is therefore useful for detecting the possible presence of defects.

After a critical step, when the defects map indicates a supposed defect, the wafer structure then must be reviewed in more detail. To review the wafer structure in more detail, the wafer structure typically is given a more detailed optical review (as mentioned in U.S. Pat. No. 5,699,447).

The defect determination possible from this second optical review is more detailed than that possible at the first optical inspection station. At this optical review station, the supposed defect of the wafer structure is studied. In particular, the supposed defect location coordinates are used to bring the supposed defect directly under the optics of the station.

Using the optical review station, there is typically made a more accurate determination as to whether there is a defect, such as a particle, in the wafer structure. Given the limited level of detail possible at the first optical inspection station, it may happen that no actual defect is noted by the second optical review station at the location where a supposed defect was indicated. In other words, the second optical inspection station may be used to differentiate between actual defects and falsely detected defects.

Optical inspection stations have been described above in relation to making a determination as to the existence of a defect. Another known station which may be used for review is a scanning electron microscope (SEM). An example of a SEM may be seen in U.S. Pat. No. 5,659,172 to Wagner et al., which is incorporated by reference. A SEM also may be used to determine the presence or absence of a defect at a location indicated by a defect map. In particular, a conventional SEM provides an SEM image of an area containing a suspected defect, the image forming the basis for a defect determination.

The present inventor has determined that the above-identified approach using only optical review or using a combination of optical and SEM review leaves much to be desired in the prevention of future defects. This deficiency in the conventional approach will now be described.

It will be recalled that not all of the manufacturing process steps, for economic reasons, are critical steps. There are normally several steps, and perhaps many steps, carried out before each critical step. The manufacturing process steps may thus be thought of as being grouped in modules, each process module culminating in a critical step and then an inspection.

Furthermore, there are now systems that support the automated processing of wafer structures. Two excellent examples of such automated processing systems are the CENTURA® system and the ENDURA® system, each available from Applied Materials®, Santa Clara, Calif. (CENTURA®, ENDURA®, and Applied Materials® are registered trademarks of Applied Materials). Automated processing systems may be understood as having an auto mated processing chamber corresponding to each step.

The chambers in the CENTURA® and the ENDURA® are arranged in a useful fashion around a robotically controlled hub, with the hub being controlled so as to deliver wafer structures from one chamber to the next at the appropriate times. Actual automated processing systems are very complex, and provide many features not explained here. It is important to note that some of the goals of automated processing systems include improving production quality, consistency, and throughput, and also minimizing manual interaction. Thus, once a wafer structure is introduced into the initial chamber of an automated processing system, access to the wafer structure is unavailable until the wafer structure is removed from the final chamber. From the final chamber, an inspection may be performed, and then the wafer structure may be introduced into the initial chamber of another automated processing system for continued manufacturing.

Using the terminology introduced earlier, an automated processing system includes a plurality of chambers. The chambers are used to carry out a corresponding plurality of steps with respect to wafer structures. The steps carried out on a given wafer structure in a given automated processing system define a module. The module has a plurality of steps, and performs each step in one of a plurality of chambers.

When a defect is found in a wafer structure during inspection, sound production engineering dictates that the cause or source of the defect be identified. This is not always simple, and involves some very practical considerations. To explain, it may be supposed that there is an automated processing system with 10 different chambers. Moreover, a different engineer typically is assigned to and responsible for each chamber. The 10 chambers define, e.g., 10 steps in a module which is part of a larger wafer structure manufacturing process.

Now, suppose a wafer structure is indicated by an optical review station as having a possible defect. The defects map is used by the optical review station to make a more detailed inspection of the supposed defect. Suppose the more detailed review of the supposed defect confirms the presence of a defect. Many defects are so small that not much useful information can be gleaned from an optical inspection of them.

Now suppose that the defective wafer structure is brought to a SEM review station for further inspection.

SEM, by its nature, has a very large depth of focus. This means that, even though there may be a plurality of layers built up on the semiconductor substrate, a substantial thickness of the wafer structure appears to be flat. Because a substantial thickness of the wafer structure appear to be flat, height contour information relating to the defect cannot be obtained, and the type of defect and the layer in which the defect occurred cannot be determined. It is known to tilt the sample at a high angle relative to the primary beam to achieve better depth resolutions, however, this procedure may obscure certain defects.

The wafer structure is placed on the stage of the SEM with the planar coordinates of the supposed defect centered under the SEM beam. The SEM "takes a picture" of the wafer structure and appears to confirm the presence of a particle. Since the wafer structure appears flat, however, it is hard to tell whether the defect is a particle or a kind of a scratch or pit. Even if it is determined that the defect is a particle, it is hard to determine ether the particle is on top of the wafer structure or is embedded in one of its layers.

The conventional approach thus yields some information about the defect, but not much. In particular, the determination of height contour information relating to the defect (i.e., whether the defect protrudes or recedes from the surface, and how much) is problematic. This limited information makes it difficult to decide where to begin to improve the production process. As a practical matter, each of the 10 engineers will insist that his particular chamber was not responsible for the defect, and that it must have happened somewhere else. The conventional approach to defect study may help eliminate one or two of the steps as causing the error (and, therefore, one or two of the chambers), but enough information to pinpoint a place to start investigating is not provided.

It will be assumed that the defect, which is a possible particle/pit/scratch, could not have occurred in two of the chambers. This leaves eight chambers, and eight engineers to deal with. The production manager may select all of the chambers for investigation in parallel, but this is very expensive in terms of time and manpower resources. The manager may select one or perhaps a few chambers based on intuition, experience, seniority of the engineer, or some other heuristic.

Presently, the foregoing situation is not atypical of current quality improvement efforts. Managers do not have enough information to suitably narrow down the possibilities, and they accept that they have to start somewhere.

A recent publication discloses a new approach in using SEM for inspection of wafers. Specifically, U.S. Pat. Nos. 5,412,210 and 5,594,245 disclose a SEM which uses a relatively high acceleration voltage so that electrons penetrate into the wafer, rebound by colliding with atoms inside the wafer, and generate secondary electrons upon hitting the surface of the wafer in the rebound trip. Using this approach, information is gathered concerning structures imbedded in the wafer. These patents also disclose that, by taking two pictures, one with the e-beam coming directly perpendicular to the wafer, and another one with the e-beam coming at an angle, one can construct a three-dimensional configuration of the imbedded structure. The relatively is high acceleration voltage used is considered by the industry as extremely undesirable and represents a crucial disadvantage of the systems and approaches described in the above-identified two patents.

The inventor has noted that it would be desirable to scrutinize only the particular one of the ten steps at which the particle was introduced. By improving the particular defect-causing step, future defects might be prevented. Even if the one step could not be identified, intelligently narrowing the number of chambers for initial study down to just a few would be a great improvement over the way quality improvement is approached today.

The inventor has determined that, to achieve such an improvement, it is necessary to obtain depth information concerning the defect so as to know the layer in which the particle is embedded. Once the layer is known, the corresponding one of the plurality of steps in the module can be identified. The step identifies the corresponding chamber. Finally, the chamber identifies the engineer that must first investigate the source of the problem.

The SEM is the review tool with the possibility to provide the most information concerning the defect. Because of the large depth of focus of the SEM, however, no further height/contour information relating to the manifestation of the defect is available. The wafer structure appears completely in focus over a substantial thickness thereof. Since the layers in question are all in focus, the wafer structure and the particle/bump/pit/scratch appear flat. Because the wafer structure and a particle appear flat, a particle looks the same whether it actually is on top of the wafer, is implanted in the first layer down, is implanted in the second layer down, or is implanted in another layer.

Because the SEM image does not yield contour information relating to which layer a particle (or other defect) may be in, it is impossible to determine from the conventional SEM which step of the module must be scrutinized.

The inventor has thus noted a need to obtain height contour information relating to a defect in a wafer structure. Such height contour information can be used to determine (or at least reasonably approximate) the depth of a defect in a wafer structure. By determining the depth of a defect in a wafer structure, the corresponding defect-introducing process step (and, hence, the corresponding chamber and responsible party) can be identified. Even if the defect might have occurred in one of two chambers, or even three, determining the depth of a defect would help a manager intelligently narrow down the number of chambers for scrutiny and thus more efficiently improve quality.

A second deficiency of the above-identified conventional approach is that many defects cannot correctly be characterized. More particularly, the conventional approach does not provide any depth information concerning a defect, and cannot reveal whether a defect is flat, is a protrusion defect, or a recess defect.

To explain, it is important first to note that even very small defects can be vitally important. In the manufacture of wafer structures, many layers are typically used. After applying a certain number of layers, the surface of a wafer structure begins to become uneven. It is difficult to apply, with precision, patterned conductor lines on an uneven surface. To correct this unevenness, a process of chemical mechanical planarization (CMP) may be undertaken.

Briefly, CMP may be conceptually understood to involve laying a comparatively thick filler layer of insulating material over the uneven surface. The filler layer fills in the uneven parts of the wafer structure. The filler layer is subsequently smoothed, or planed. The planarization may be thought of as a polishing activity. Inherent to any polishing activity is the likelihood of producing small scratches on the surface to be smoothed.

In wafer structures, such scratches may be extremely small. Extremely small scratches may appropriately be called microscratches. Microscratches can be especially problematic for two main reasons. First, microscratches are difficult to detect. Second, microscratches sometimes form a subsurface channel. During manufacturing, conductive material may be unintentionally disposed in a microscratch and might not be completely removed. When filled with conductive material, a microscratch may therefore create a short circuit.

Microscratches have been explained to show an example of a recess defect, to show that even very small defects can be important, and that it is important to detect as many defects as possible. Since the conventional optical and SEM provide only one image, however, it is hard to characterize correctly such small defects.

If a defect could be confirmed as a scratch, then the attention of a manager would be drawn to a CMP chamber. If a defect could be identified a protrusion such as a bump or a particle, then other chambers would command the manager's attention. A flat defect would often mean a pattern disposed in an incorrect location. Whether a defect is flat, is a protrusion, or is a recess may be referred to as depth information concerning the defect. Another way of referring to this information is to describe it as height contour information or, more simply, contour information. Even without knowing the depth of a defect with respect to the layers of the wafer structure, knowing the contour information about a defect would help a manager to know the defect's shape, and to make a more intelligent decision as to which chamber is the best candidate for initial investigation.

Consequently, it is very desirable to have an automatic classification of the defects. That is, in addition to having the inspection equipment provide a defect map and overall defect density, it would be very desirable for the equipment to also provide classified defect density, i.e., the density of the defects by classes. However, to do that, the equipment would have to be able automatically to classify the defects. This is a very complicated engineering problem, and is currently being approached by seeking solutions using image analysis. However, it would be helpful to support or to enhance the automatic classification using more information, such as depth and topography information, which can help in finding the root cause of the problem.

The above-identified equipment and approaches give neither the height or depth of a defect, nor any contour information.

SUMMARY OF THE INVENTION

It is an object of this invention to overcome the deficiencies and shortcomings mentioned above. In particular, it is an important object of this invention to set forth a method and a SEM review station for determining the depth and topography of a defect in a wafer structure.

It is another object of the invention to set forth a method and a SEM review station for providing contour information relating to a defect so that the defect may be characterized and classified.

The foregoing objects of the invention, in brief, are realized in the use of multiple SEM images to determine contour information for determining the depth (or height) of a defect in a wafer structure. In one embodiment, stereoscopic SEM images are used. In another embodiment, multiple perspective images are used.

BRIEF DESCRIPTION OF THE DRAWINGS

FIG. 10(a) shows a height contour of a particle which is imbedded underneath a desired feature.

FIG. 10(b) shows how the imbedded particle of FIG. 10(a) might appear if the structure of FIG. 10(a) were cut along line X—X.

DETAILED DESCRIPTION OF THE PREFERRED EMBODIMENT

The presently preferred embodiment of the invention will be explained with reference to the above-identified figures.

Figure 1:
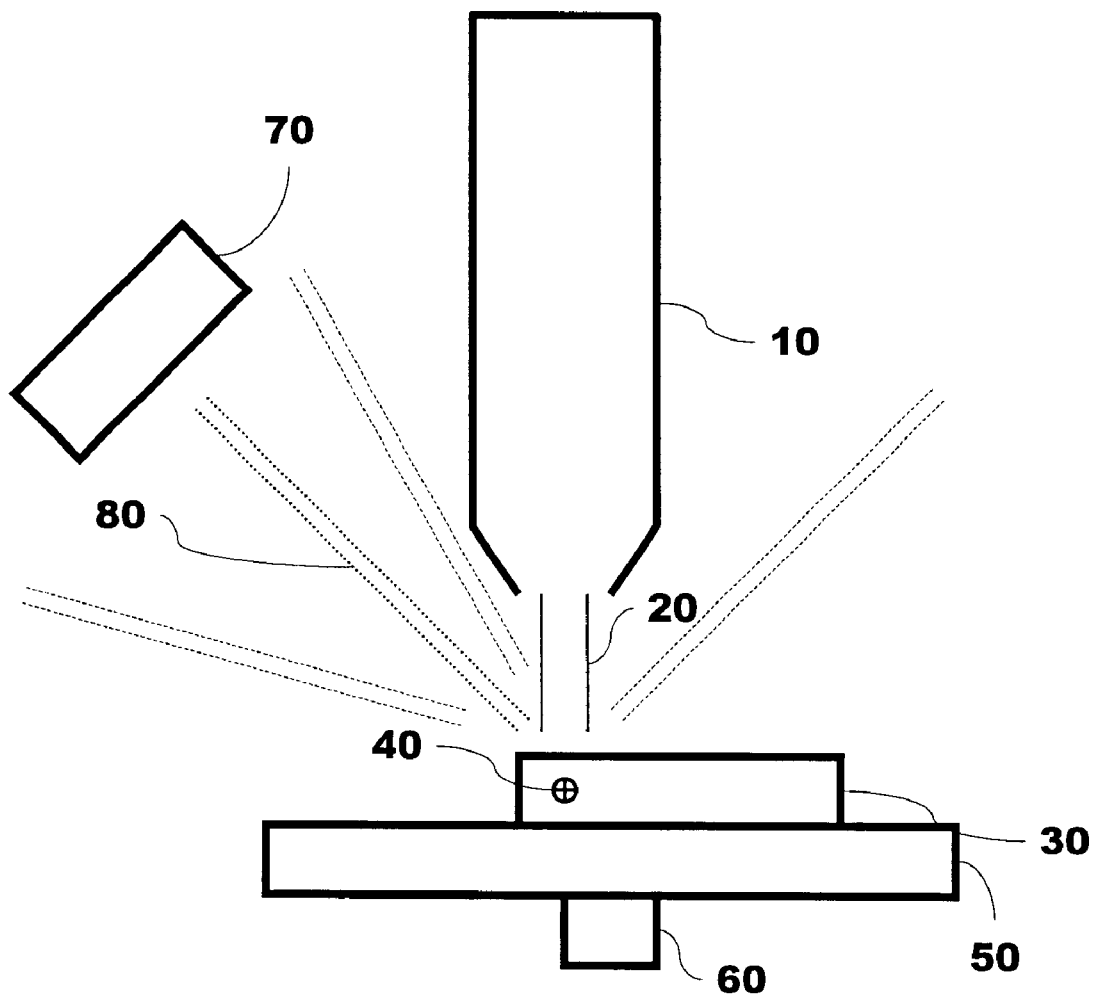
FIG. 1 shows a schematic and cross-sectional view of part of a SEM review station.

FIG. 1 shows SEM column 10 emitting electron beam 20 preferably at an accelerating voltage of 200 eV to 1 KeV. Electron beam 20 is incident upon wafer structure 30. Wafer structure 30 has been identified by an optical inspection station (not shown) as having a supposed defect at a location of $(x_0, y_0)$. Location $(x_0, y_0)$ is shown on wafer structure 30 as defect 40. It will be noted that defect 40 is shown as being directly under electron beam 20.

Wafer structure 30 rests upon turntable 50. Turntable 50 is supported by support member 60, which is supported by a stage (not shown). Support member 60 is rotatable. Turntable 50 may be tiltable. Typical stages provide for decoupled motion in x and y directions. That is, one mechanism moves the stage in an x direction. Another mechanism moves the stage in the y direction. The support member may be thought of as being provided on top of the stage.

Defect 40 is not, at first, positioned directly under electron beam 20. It must be located. To achieve proper location of the defect with respect to electron beam 20, the stage supporting support member 60 will have to be moved in the x and y directions as appropriate to place the defect in the proper location with respect to the electron beam.

Rotating the wafer structure on its turntable 50, as a practical matter, also moves the defect to an unsuitable location with respect to electron beam 20. When this happens, the defect must be re-located. This involves moving the stage supporting support member 60 in the x and y directions as appropriate.

Disposed near SEM column 10 and turntable 50 is sensor 70. Sensor 70 detects some secondaries and some backscatter electrons. Electrons proceed from wafer structure 30 in all directions, as represented in a very simplified form by the dotted lines in FIG. 1. The detected portion of the secondaries and of the backscatter electrons from electron beam 20 may, for linguistic convenience, be generally referred to as sensed electrons and are represented by reference numeral 80.

Sensor 70 is disposed so as to receive sensed electrons 80 and to provide a SEM image representative of the surface of wafer structure 30. Sensor 70 is conventional and will not be described in detail herein. Because defect 40 is directly under electron beam 20, the image reproduced from the detection of sensed electrons 80 by sensor 70 includes a representation of defect 40. FIG. 1 shows sensor 70 positioned to the left of wafer structure 30. An example of such a sensor may be found in U.S. Pat. No. 4,941,980 to Halavee et al., and is herein incorporated by reference.

There are known sensors that have a shape like a doughnut and are positioned within SEM column 10; in such sensors electron beam 20 passes through the middle of the sensor on the way to the wafer structure, and the sensed electrons are detected afterward. An example of such a sensor may be found in U.S. Pat. No. 5,466,940 to Litman et al., and is herein incorporated by reference.

For the sake of clarity, certain aspects of scanning electron microscopy will now be discussed. Scanning electron microscopy may be conceptually thought of as being opposite to normal optical microscopy in various aspects.

In normal optical microscopy, a viewer places his sensor (eye or CCD array) over a lens (eyepiece). The lens is directly over an object to be viewed. The object is illuminated by a light source. Suppose the light source is to the left of the viewer. The image perceived (in the mind of the viewer) is that of viewing the object from the directly overhead perspective, with the illumination coming from the left. If the light source is moved to the right, the image perceived is that of viewing the object from the directly overhead perspective, with the illumination coming from the right.

In scanning electron microscopy, the image perceived is that of viewing the object from the perspective of the source of illumination (the electron beam), and the image perceived appears to be illuminated as if the illumination were coming from the location of the sensor.

Returning to FIG. 1, the electron beam 20 is emitted by SEM column 10 from directly overhead with respect to wafer structure 30. The sensor 70 is to the left in the drawing figure. The image provided after image processing of sensed electrons 80 is that of viewing wafer structure 30 from the directly overhead perspective (i.e., from where the electron beam 20 emanated), with the illumination coming from the left (i.e., from where the sensor 70 is disposed). If sensor 70 is moved to the right, the image perceived is that of viewing the object from the directly overhead perspective, with the illumination coming from the right.

The importance of these certain aspects of scanning electron microscopy will be appreciated when kept in mind during the following discussion of the invention.

Because there are a plurality of steps for each semiconductor processing module, the inventor has noted that it would be advantageous to determine the layer in which a particular defect is located so that a corresponding module step and its chamber may be scrutinized. Because conventional scanning electron microscopy provides a substantially flat image, as mentioned above, the inventor has invented a method whereby contour information for determining the layer in which a defect is located may be determined. In particular, the invention involves preparing a three-dimensional representation of the defect. Using this three-dimensional representation, it is possible to determine which layer contains the defect by calculating the depth thereof.

In the invention, a stereoscopic SEM image is produced. A stereoscopic image provides a three-dimensional representation of the wafer structure 30 at the location of defect 40.

One manner of producing a stereoscopic SEM image will now be described with reference to FIGS. 1, 2(a), 2(b), 3(a), and 3(b). It is to be understood, however, that the invention generally relates to any method of producing such an image, and is not intended to be limited to this particular exemplary embodiment.

Figure 2A:
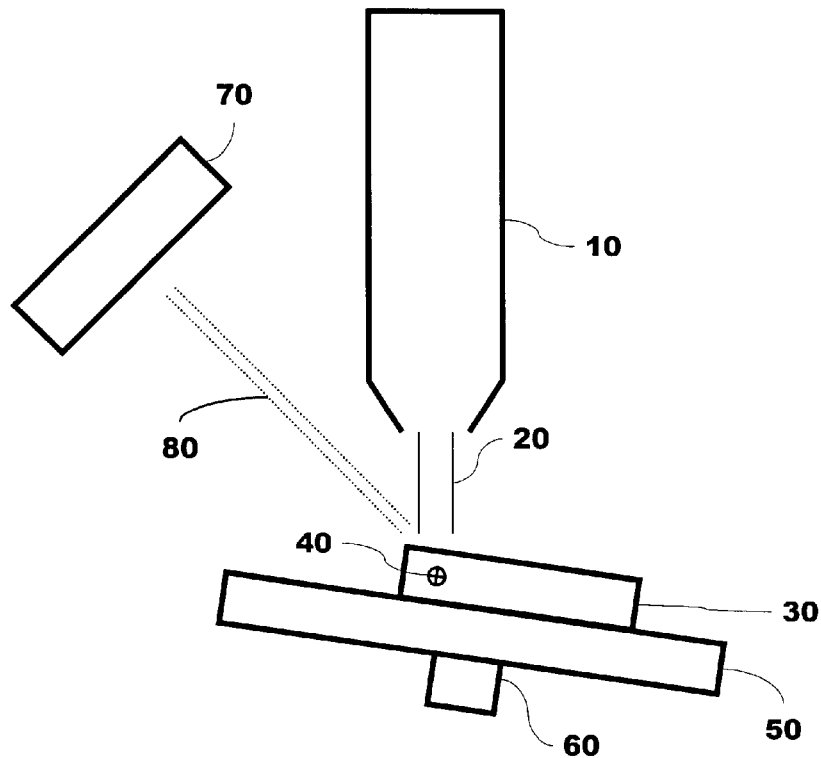
FIG. 2(a) shows a schematic and cross-sectional view of part of a SEM review station according to the invention with a wafer structure in a first tilted position.

It will be noted that, in FIG. 1, turntable 50 is substantially perpendicular with respect to electron beam 20. In FIG. 2(a), however, turntable 50 no longer is substantially perpendicular but is tilted at a predetermined inclination with respect to electron beam 20. As illustrated, the inclination is 8°. The precise inclination is not critical for the understanding of this embodiment, but it will be appreciated by those familiar with this field that too great of an angle will reduce the visibility of lower defects.

Figure 2B:
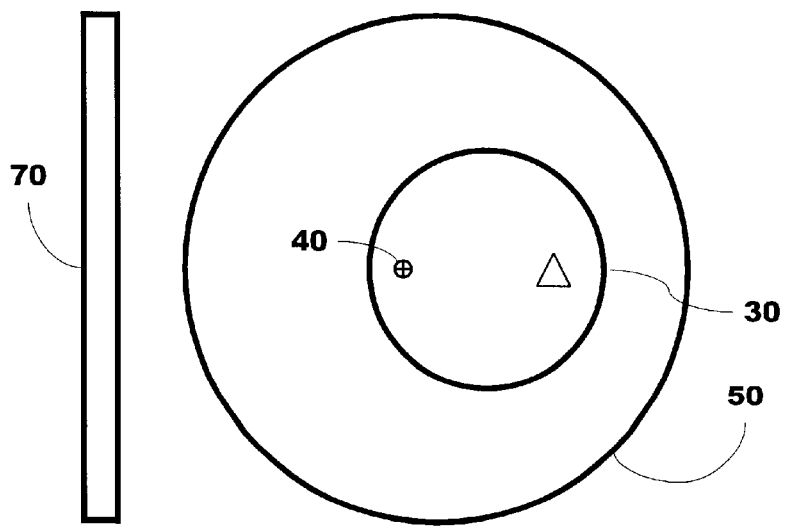
FIG. 2(b) shows a plan view of part of a SEM review station according to the invention with a wafer structure in the first tilted position.

FIG. 2(b) shows turntable 50, wafer structure 30, and defect 40 at the same time as in FIG. 2(a), but from the point of view of SEM column 10. In FIG. 2(b), it may be assumed that turntable 50 has been tilted along a substantially vertical line so that the left side of turntable 50 is closer to the electron beam 20 (the viewer) than is the right side. Also shown in FIG. 2(b) is a triangle which is depicted to provide a reference mark for comparison with FIG. 3(b). Defect 40 is centered under electron beam 20. Electrons proceed to impact the area around defect 40 and SE and BSE are detected by sensor 70. Due to the above-identified certain aspects of scanning electron microscopy, the image that may be made from the sensed electrons will have a perspective as if viewed from the top, but inclined 8° to one side (to the left in this example), and the illumination will appear to be coming from the left.

The position of turntable 50, wafer structure 30, and defect 40 in FIGS. 2(a) and 2(b) may be referred to as a first position, or as a tilted position. The image produced therefrom will be referred to as a first image.

Figure 3A:
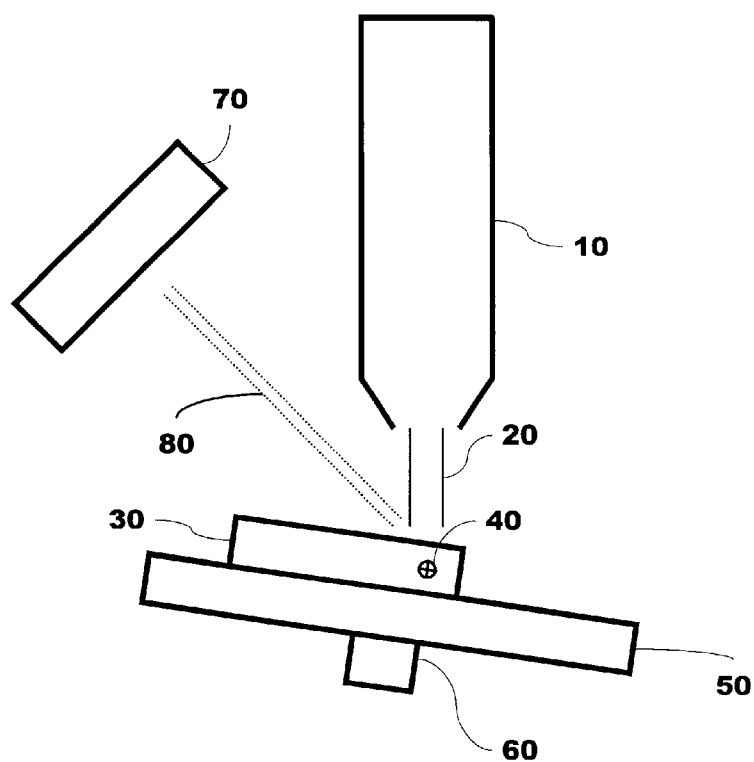
FIG. 3(a) shows a schematic and cross-sectional view of part of a SEM review station according to the invention with a wafer structure in a second tilted position.

FIG. 3(a) shows turntable So after it has been rotated from its tilted position by 180°. The turntable 50 has the same angle of inclination of 8°, but has been rotated about support member 60. This other position shown in FIGS. 3(a) and 3(b) may be referred to as a second position, or as a tilted-rotated position.

Figure 3B:
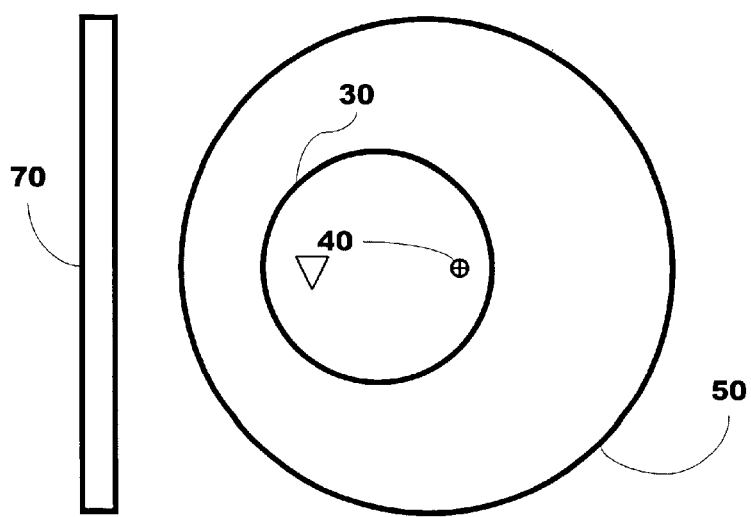
FIG. 3(b) shows a plan view of part of a SEM review station according to the invention with a wafer structure in the second tilted position.

FIG. 3(b) shows turntable 50, wafer structure 30, and defect 40 at the same time as in FIG. 3(a), but from the point of view of SEM column 10. The angle of inclination is as in FIG. 2(b), so that the currently left side of the turntable 50 is closer to the electron beam 20 (the viewer) than is the right side. Defect 40 is shown after the stage supporting support member 60 has been moved in the x and y directions as appropriate to put it directly under electron beam 20. The triangle used as a reference symbol in FIG. 2(b) is again shown in FIG. 3(b) to illustrate that the image resulting from scanning in the second position is flipped over.

Thus, electrons from electron beam 20 proceed to impact the area around defect 40 and are detected by sensor 70. The image "seen" by electron beam 20 has been rotated 180°, however, as shown by the reference triangle. Therefore, the discussion of the image that will be produced will be based on the understanding that, after the image has been produced, the image will be rotated 180° so as to be in the same orientation as the image produced from FIGS. 2(a) and 2(b). This image, after rotation as just described, will be referred to as a second image.

The first image is produced with a viewing angle of +8° normal to the wafer, and the second image is produced with a viewing angle of −8° normal to the wafer. Of course, other angles can be used, e.g., ±2°–10°. Sensor 70 may be either an external or an in-lens detector.

These two images, although taken at different times, constitute a plurality of SEM images of the area of the supposed defect. Since two different perspectives of substantially the same scene are produced, a stereoscopic image may be realized by combining the two images in a known manner. For more information on this subject, see, e.g., the following reference which is incorporated herein by reference for its useful background on this topic:

> M. R. Lee, "From atomic-scale defects to global environmental change; applications of SEM and TEM to mineral weathering," Microscopy and Analysis, November 1997, pp. 19–21.

The stereoscopic image resulting from combining the first and the second images provides a three-dimensional effect and overcomes the problem of SEM images appearing flat. With the resulting stereoscopic image, the contour information (and, thus, the depth) of a defect such as a particle can be determined using known algorithms for calculating distances for stereoscopic images. When the depth is determined, it can also be determined which layer contains the defect using the known thickness of the various layers. For more information depth calculation algorithms, see, e.g., the following references which are incorporated herein by reference for their useful background:

> Faugeras, O., *Three Dimensional computer Vision: A Geometric Viewpoint*, Chapter 6, MIT Press, 1993.
>
> Forstner, W. and Pertl, A., "Photogrammetric standard methods and digital images matching techniques for high precision surface measurements," in *Pattern Recognition in Practice II* (Gelsema, E. S., and Kanal, L. N., eds.), Elsevier Science Publishers, 1986.

The step in which the layer was produced can be scrutinized. Scrutiny of the corresponding step may, when effective, result in improved quality and fewer defects.

It will be appreciated that it is possible to tilt SEM column 10 instead of tilting support member 60. For an example of how to tilt SEM column 10 instead of tilting a support member 60, see U.S. Pat. No. 5,329,125 to Feuerbaum, which is incorporated by reference. The spirit of the invention is not violated by rotations and tilts accomplished in ways not detailed above.

As has been pointed out, whenever the defect 40 is not positioned directly under electron beam 20, the stage supporting support member 60 will have to be moved in the x and y directions as appropriate to place the defect in the proper location with respect to the electron beam.

A variation of the foregoing first embodiment will now be briefly discussed with reference to FIGS. 4, 5, and 6. Like items are numbered the same as in FIGS. 1 through 3(*b*), and are not again covered in detail.

Figure 4:
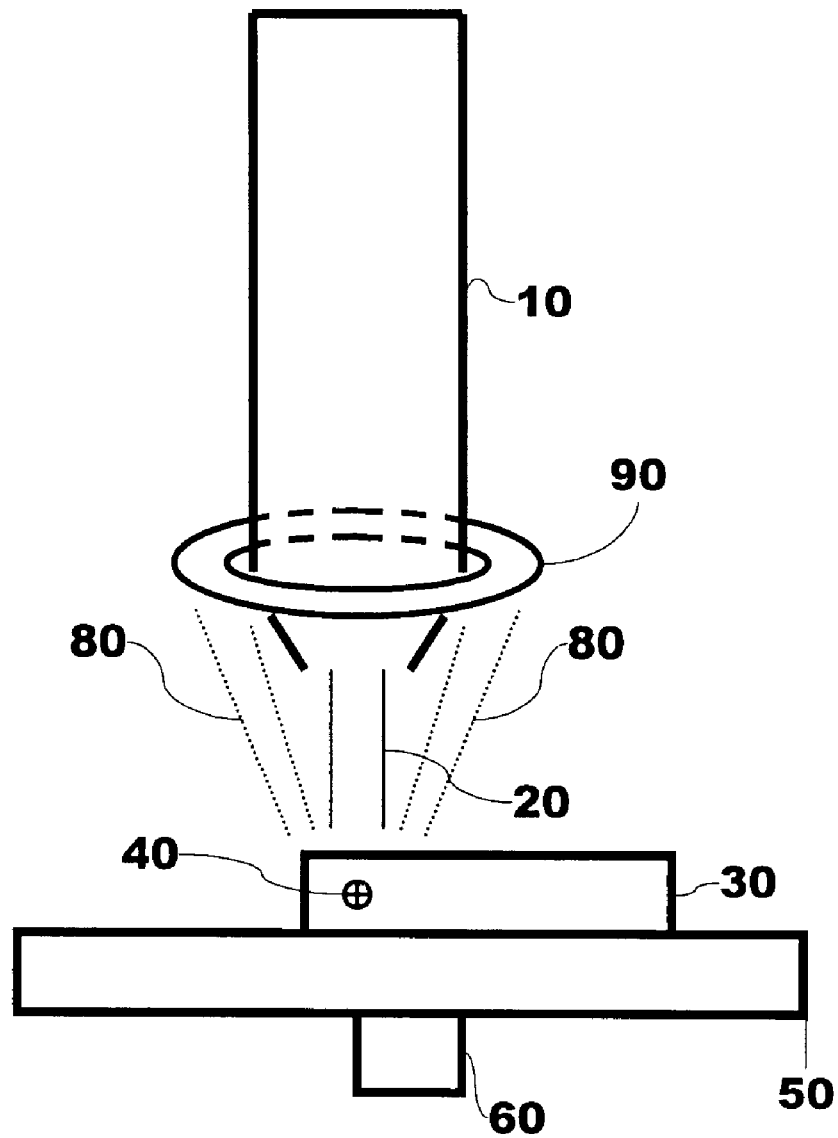
FIG. 4 shows a schematic and cross-sectional view of part of a SEM review station which has a sensor of a different type.

FIG. 4 is different from FIG. 1 in that sensor 70 has been replaced with doughnut shaped sensor 90. Sensor 90 is shown as being disposed around SEM column 10. This is only for the sake of simplified illustration. Actual implementations of sensors that are concentric with the electron beam 20 are different. In the sensor available from OPAL Technologies Ltd. (P.O. Box 416, Nes Ziona, Israel), the detector is inside the electron column and above the objective lens, with the detector being split into four quadrants.

The impinging of electron beam 20 on the wafer produces electrons in substantially all directions, but the portion detectable by sensor 90 may usefully be thought of as sensed electrons 80.

Figure 5:
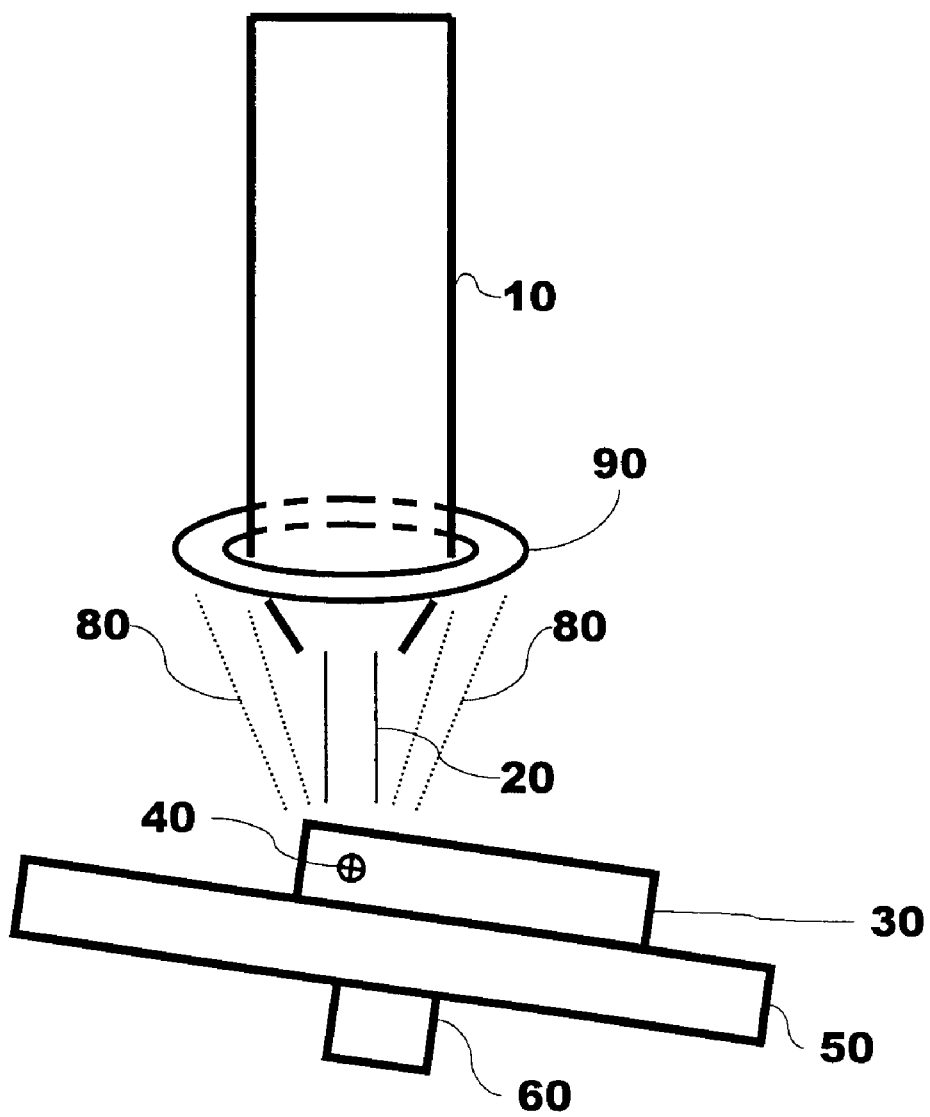
FIG. 5 shows the SEM review station of FIG. 4 with the wafer structure in the first tilted position.
Figure 6:
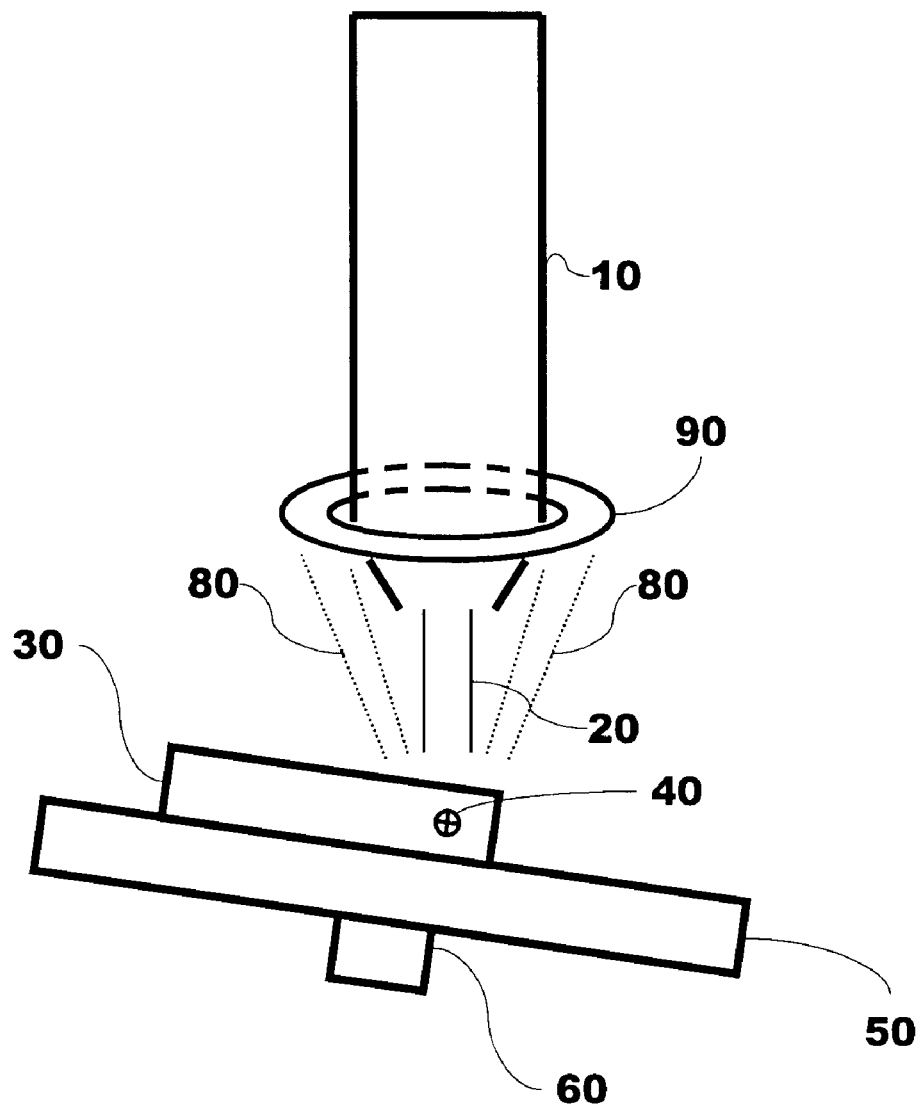
FIG. 6 shows the SEM review station of FIG. 4 with the wafer structure in the second tilted position.

FIG. 5 shows the SEM review station of FIG. 4 with the turntable 50 and wafer structure 30 in the first, or tilted position. FIG. 6 shows the station with the turntable 50 and wafer structure 30 in the second, or tilted-rotated position.

This variation of the first embodiment operates in substantially the same manner as the first embodiment. That is, a first image is taken in the first position; an image is taken in the second position and rotated to provide a second image; and the first and the second images are combined to provide a stereoscopic image.

Figure 7:
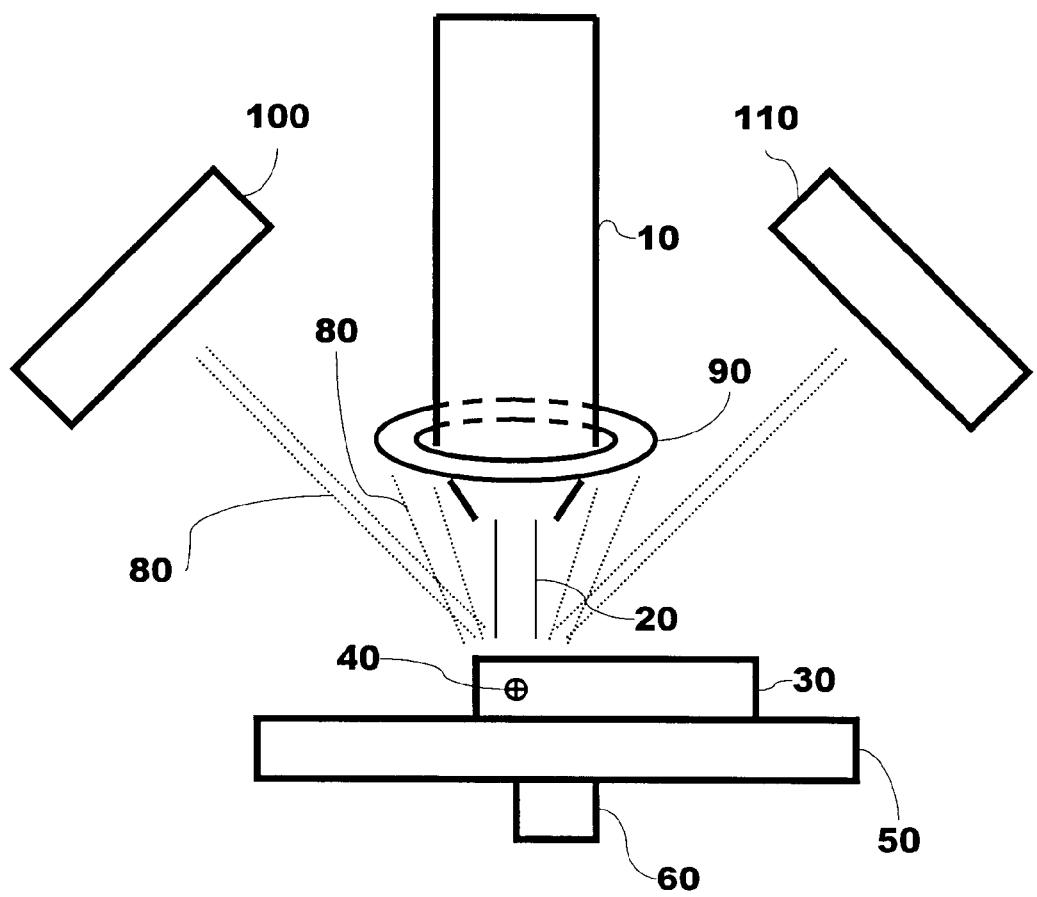
FIG. 7 shows a schematic and cross-sectional view of part of a SEM review station according to a second embodiment of the invention.

A second embodiment of the invention will now be discussed with reference to FIG. 7. This embodiment is very useful with respect to the automatic classification of defects. FIG. 7 shows another SEM review station for determining contour information concerning defects in wafer structures using multiple SEM images. In other words, the SEM review station of the second embodiment helps determine whether a defect is a protrusion, like a particle, or a recess, like a pit or a scratch. The second embodiment of the invention does not, however, involve stereoscopic images.

FIG. 7 is similar to FIG. 4, but differs in some important respects. The station shown in FIG. 7 comprises a plurality of sensors providing images of different perspectives (this may be thought of as a multiple-perspective view). In this exemplary embodiment, there is a first sensor 90 located centrally with respect to the SEM column 10. There is a second sensor 100 located to the left, and a third sensor 110 located to the right.

Unlike the station of the first embodiment, the station of the second embodiment involves taking three images at substantially the same time but from different perspectives. The wafer structure 30 is neither tilted nor rotated. The image produced by first sensor 90 will be referred to as a first image; that from second sensor 100 as a second image; and that from third sensor 110 as a third image. Nevertheless, these labels are for linguistic convenience only, and not meant to imply any order or sequence in image detection.

As a result, it will be appreciated that the first image has the perspective of electron beam 20 (i.e., directly overhead) and appears as if the illumination is coming from first sensor 90 (i.e., also directly overhead). The second image has the same identical perspective as the first image (i.e., the perspective of viewing from directly overhead), but appears as if the illumination is coming from second sensor 100 (i.e., illumination from the left). The third image, like the second and first images, has an identical overhead perspective, but appears as if the illumination is coming from the right (i.e., from third sensor 110).

The three images thus each provide different information with respect to bright and dim features of is the area of defect 40, and all from an identical perspective. Thus, a particular feature which appears flat when viewed from only directly overhead might look differently when viewed in connection with the other two images. It is important to remember that the defects are extremely small, and that some defects may only prove detectable in one of the three images.

In essence, the second and third images provide greyscale shadow information useful for characterizing the defect, and the second image provides an overhead, substantially flat view.

Greyscale shadow information has long been used in mapping to produce accurate contour maps from overhead camera shots. For example, high-altitude airplanes equipped with cameras may provide photographic images which are themselves two-dimensional, but which have shadows useful in extracting the topography (i.e., the contour information) of the surface of the earth.

FIG. 10(*a*) shows how a subsurface defect might be manifested in a wafer structure. In particular, wafer structure 30 includes a substrate 150. A contact line is formed from a first layer 160 and a second layer 170. Along line X—X is a bump 180 which is a manifestation of a defect 40 (see FIG. 10(*b*)).

FIG. 10(*b*) shows what the wafer structure of FIG. 10(*a*) might look like if cut along line X—X. In particular, defect 40 is a particle that is imbedded in the wafer structure. More particularly, defect 40 is on top of first layer 160, but under second layer 170. Because of the presence of particle defect 40, the second layer has bump 180. The three-dimensional shape of the bump 180 is the contour information relating to the defect.

Figure 11:
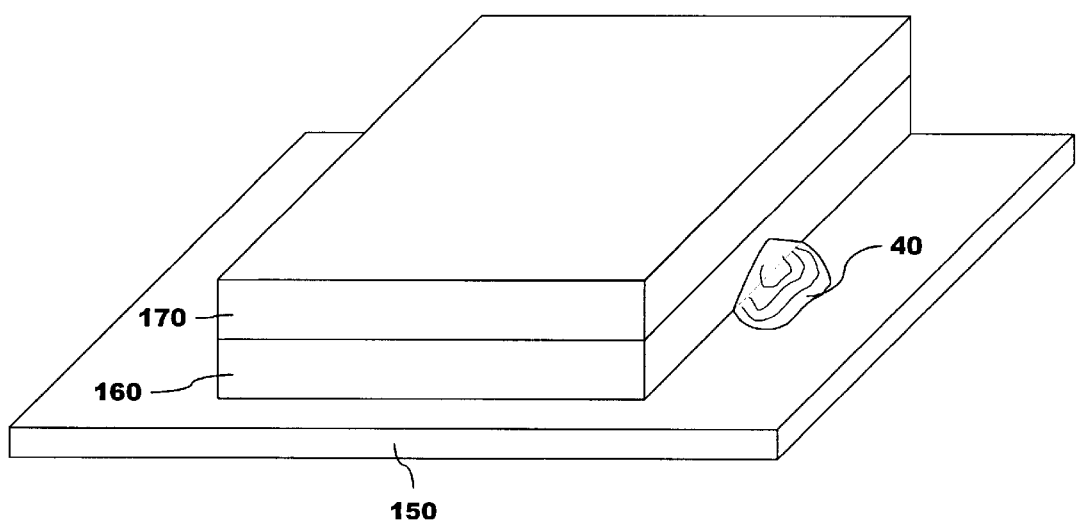
FIG. 11 shows a height contour of a pattern defect.

FIG. 11 shows how an unwanted pattern defect might be manifested in a wafer structure. In particular, wafer structure 30 includes a substrate 150. A contact line is formed from first layer 160 and second layer 170. Adjoining part of first layer 160, however, is unwanted pattern defect 40. The three-dimensional shape of defect 40 is the contour information relating to this defect.

Figure 8A:
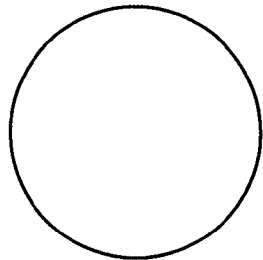
FIGS. 8(a), 8(b), and 8(c) show how a defect might be viewed using different sensors.
Figure 8B:
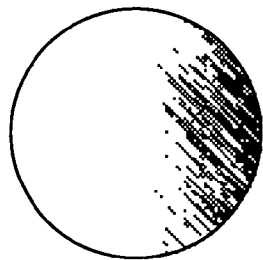

One way to appreciate the advantage of the invention according to this second embodiment is to imagine a bump (as in bump 180 of FIG. 10(*a*)) protruding from a planar surface. This bump represents a defect. viewing this bump from directly overhead, with illumination from overhead, the bump may appear as a flat pattern or stain as drawn in FIG. 8(*a*). Such a result might obtain from an image produced by first sensor 90. Using conventional image analysis based on this image alone, it would be difficult to characterize and classify this defect, e.g., as a flat circle, a protruding bump, or a pit.

In an image produced from second sensor 100, the perspective of the viewer is still directly overhead, but with the illumination appearing to come from the left. Under these conditions, the bump may appear as having a brighter part on the left, and a dimmer part on the right, as drawn in FIG. 8(*b*). Thus, it may be determined that defect 40 is a protrusion and not a pit.

In an image produced from third sensor 110, the perspective of the viewer is still directly overhead, but with the illumination appearing to come from the right. Under these conditions, the bump may appear as having a brighter part on the right, and a dimmer part on the left, as drawn in FIG. 8(c). The determination of defect 40 as a protrusion is thus confirmed. For example, to increase the level of confidence the greyscales produced from the second sensor can be compared to those produced by the third sensor.

Figure 8C:
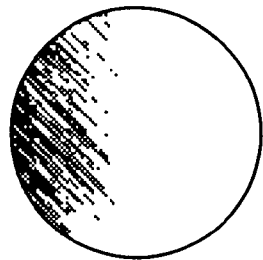

On the other hand, assume defect 40 is a pit. The image produced by first sensor 90 might still be as drawn in FIG. 8(a). The image produced by second sensor 100 would show a darker area on the left and lighter area on the right of the pit, as shown in FIG. 8(c). Likewise, the image produced by the output of third sensor 110 would show a darker area on the right and a lighter area on the left of the pit, as drawn in FIG. 8(b).

The importance of multiple sensors will now be stressed using FIGS. 9(a–e). FIG. 9(a) shows a part of wafer structure 30 with defect 40 as a microscratch. FIG. 9(b) shows a simplified cross-sectional view of wafer structure 30 along reference line B—B. As shown in FIG. 9(b), the microscratch (i.e., defect 40) is a vertical scratch having a substantially wall-like left side and a gently sloping right side. Although FIG. 9(a) shows upper and lower ends of this defect 40, these are simply for reference and ease of illustration. It is much more likely that the microscratch has gently sloped ends.

Figure 9A:
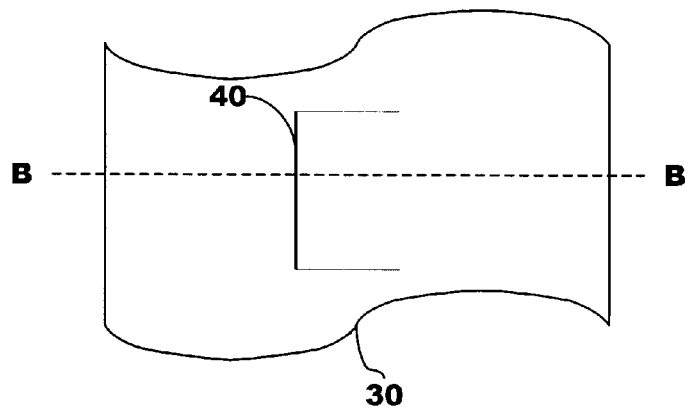
FIG. 9(a) depicts a part of the surface of a wafer structure, after CMP, and having a microscratch.
Figure 9B:
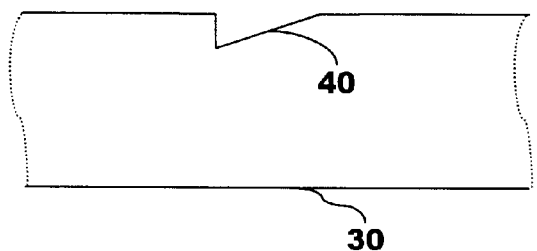
FIG. 9(b) depicts a simplified cross-sectional view of the wafer structure in FIG. 9(a) along line B—B.
Figure 9C:
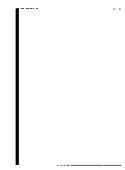
FIGS. 9(c), 9(d), and 9(e) show how the microscratch might be viewed using different sensors.

FIG. 9(c) shows how this defect 40 might appear from first sensor 90. Inasmuch as the illumination in the image provided from the data of first sensor 90 appears to be from overhead, no shadows appear; the image from first sensor 90 appears to be flat, and the microscratch appears to be only a linear feature. No contour information is available in this first image.

Figure 9D:

FIG. 9(d) shows how this defect 40 might appear from second sensor 100. The illumination appears to come from the left, and thus a shadow is cast by the substantially wall-like left side of the microscratch. Given the length of the shadow and the position of second sensor 100, information as to the depth of the microscratch can be determined.

Figure 9E:
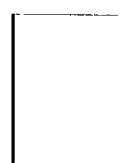

FIG. 9(e) shows how this defect 40 might appear from third sensor 110. The illumination appears to come from the right in such an image, but the gently sloping right side of the microscratch gives no shadow. Because of the inclination of the wall-like left side of the microscratch, the image provided from the output of third sensor 110 appears flat, and defect 40 appears to be only a linear feature.

In this example, the defect 40 was substantially linear. Defects will rarely have so simple a structure, and so the information available from the three images taken together will normally reveal enough to detect and to characterize most defects.

The foregoing example is intended to demonstrate, in a simplified manner, that sometimes contour information relating to a defect will be available directly from only one of a plurality of SEM images. The example thus further demonstrates that the second embodiment of the invention, with its three sensors, is a substantial improvement over the conventional SEM station.

To summarize, the first embodiment provides a plurality of images of a defect, with the images being taken from different SEM perspectives. The different SEM perspectives in the exemplary embodiment are obtained by taking images having different angles between an electron beam and a wafer structure. Other ways of providing different SEM perspectives are possible and fall within the scope and spirit of the invention. The plurality of images are combined to provide a stereoscopic image upon which an algorithm is operated to provide the depth of the defect. The depth of the defect identifies the layer in the wafer structure and, hence, the corresponding step and chamber in which the defect was introduced.

The second embodiment provides contour information using a plurality of images of a defect, with the images being simultaneously taken with different SEM sensors at different positions with respect to the defect. The different SEM illuminations are provided in the exemplary embodiment using multiple sensors. Other ways of providing such images, such as moving a single sensor to multiple positions, are possible and fall within the scope and spirit of the invention. The plurality of images are compared. The differences in shading of the defect in the plurality of images are analyzed to determine the contour information. More specifically, the analysis determines whether the defect is flat, is a protrusion, or is a recess.

It will also be recognized by those familiar with this field that the several images may simultaneously be displayed on a screen for inspection and, at the same time, used for processing in an automated manner. It will be further recognized that, even though the term "image" has been used extensively in the description of the invention, the actual production of visual images is not strictly necessary to the practice of the invention. That is, the signals obtained from the sensors or detectors may themselves be processed to calculate contour information without producing an image that can be comprehended by a human. For the purposes of this invention, therefore, the "taking" of an image does not necessarily mean that a visual image is ever produced.

It will also be appreciated that the first and second embodiments may be combined. That is, a SEM review station may have multiple sensors (two, for example), and also may be able to provide a tilt between the wafer structure and the electron beam so that stereoscopic images could be produced. In such a case, either or both of the images produced with the wafer structure in the first position may be used to produce a first image. Either or both of the images produced with the wafer structure in the second position may be used to produce a second image. The thus-obtained first and second images may be stereoscopically combined to provide the defect depth, and all of the images may be used to obtain contour information so that the defect may be suitably characterized.

Although the invention has been described with respect to a few specific embodiments, and in many particulars, it will be appreciated that many modifications may be made without departing from the spirit of the invention, namely, the determination of depth and the acquisition of contour information about defects by inspecting several images. Thus, the scope of this patent is not to be limited merely to the disclosed embodiments, but is to be interpreted in view of the following claims.

What is claimed is:

1. A method of using scanning electron microscopy (SEM) to inspect a wafer structure defect, comprising:

producing an electron beam and causing said electron beam to impinge on said wafer structure at a first angle at the location of said defect by tilting said wafer structure with respect to an electron column;

producing a first image of said defect;

causing said electron beam to impinge on said wafer structure at a second angle different from said first angle by rotating said wafer structure with respect to said electron column;

producing a second image of said defect;

producing a stereoscopic image based on said first image and on said second image including rotating the data of one of said first image and said second image; and calculating a depth of said defect from said stereoscopic image.

2. A method of using SEM to determine contour information for a wafer structure defect, comprising:

illuminating the defect with an electron beam;

obtaining first and second images of said defect, each with a different respective electron detection direction;

comparing shading effects in said first image and said second image to determine said contour information.

3. The method of using SEM to determine contour information for a wafer structure defect as set forth in claim 2, wherein said first image and said second image are concurrently taken.

4. A method of using scanning electron microscopy (SEM) to inspect a wafer structure defect, comprising:

producing an electron beam and causing said electron beam to impinge on said wafer structure at a first angle at the location of said defect;

producing a first image signal relating to said defect;

causing said electron beam to impinge on said wafer structure at a second angle different from said first angle;

producing a second image signal relating to said defect;

analyzing said first image signal and said second image signal to determine contour information for said defect; and calculating a depth of said defect from said contour information and using said depth to determine a process step during which said defect was introduced.

5. The method of using SEM to inspect a wafer structure defect as set forth in claim 4, wherein:

said step of causing said electron beam to impinge at said first angle includes tilting said wafer structure with respect to an electron column to attain said first image signal, said step of causing said electron beam to impinge at said second angle includes rotating said wafer structure with respect to said electron column to attain said second image signal; and said step of analyzing said first image signal and said second image signal to determine said contour information for said defect comprises logically rotating the data of one of said first image signal and said second image signal.

* * * * *